US008696350B2

(12) United States Patent
Ohara

(10) Patent No.: US 8,696,350 B2
(45) Date of Patent: Apr. 15, 2014

(54) HEAT-TREATING FURNACE

(75) Inventor: Takashi Ohara, Nango Otsu (JP)

(73) Assignee: Murata Manufaturing Co., Ltd., Kyoto (JP)

(*) Notice: Subject to any disclaimer, the term of this patent is extended or adjusted under 35 U.S.C. 154(b) by 1229 days.

(21) Appl. No.: 12/235,952

(22) Filed: Sep. 23, 2008

(65) Prior Publication Data
US 2009/0029307 A1 Jan. 29, 2009

Related U.S. Application Data

(63) Continuation of application No. PCT/JP2007/055410, filed on Mar. 16, 2007.

(30) Foreign Application Priority Data

Mar. 23, 2006 (JP) ................................. 2006-081539

(51) Int. Cl.
F27D 1/00 (2006.01)
(52) U.S. Cl.
USPC ........................... 432/247; 219/407; 219/424
(58) Field of Classification Search
USPC ........... 432/31, 175, 178, 206, 212, 213, 224, 432/247; 219/390, 405, 406, 407, 424; 126/64, 92 B, 92 C
See application file for complete search history.

(56) References Cited

U.S. PATENT DOCUMENTS

| | | | | |
|---|---|---|---|---|
| 2,002,241 A * | 5/1935 | Forde | ............................. | 432/120 |
| 3,026,399 A * | 3/1962 | Lighter | ......................... | 219/405 |
| 3,197,185 A * | 7/1965 | Beattie | .......................... | 432/120 |
| 3,370,155 A * | 2/1968 | Belliveau | ....................... | 219/406 |
| 3,930,488 A | 1/1976 | Wallis et al. | | |
| 4,268,708 A | 5/1981 | Smith, Jr. et al. | | |
| 4,916,290 A * | 4/1990 | Hawkins | ........................ | 219/385 |
| 5,017,209 A * | 5/1991 | Yoshimura | ....................... | 65/499 |
| 6,021,155 A * | 2/2000 | Jones | ............................. | 373/130 |
| 6,369,361 B2 * | 4/2002 | Saito et al. | .................... | 219/390 |
| 6,435,866 B1 * | 8/2002 | Ghosh et al. | .................. | 432/206 |
| 6,683,283 B2 * | 1/2004 | Schmidt | ........................ | 219/424 |

(Continued)

FOREIGN PATENT DOCUMENTS

CN 2396356 Y 9/2000
DE 1 471 377 A1 1/1969

(Continued)

OTHER PUBLICATIONS

Official Communication issued in corresponding Chinese Patent Application No. 2007800061677, issued on Sep. 11, 2009.

(Continued)

Primary Examiner — Gregory A Wilson
(74) Attorney, Agent, or Firm — Keating & Bennett, LLP

(57) ABSTRACT

A heat treating furnace capable of continuously performing binder removal and subsequent firing without requiring a complicated configuration and increasing the equipment size and cost, for example, for degreasing a ceramic molding which is to be fired in a process for manufacturing a ceramic electronic component. A heat insulator is disposed to surround a heat treatment region in a case, and a reflector is disposed between the inner wall of the case and the insulator in order to reflect heat transferred from the heat treatment region through the heat insulator. A module heater including a heater embedded in the insulator is used. As the reflector, there is used a reflector having a structure in which a plurality of thin plates is arranged so that the main surfaces are arranged in parallel to each other with a predetermined space between the adjacent main surfaces.

5 Claims, 7 Drawing Sheets

(56) References Cited

U.S. PATENT DOCUMENTS

| | | | |
|---|---|---|---|
| 6,756,565 B2 * | 6/2004 | Suenaga et al. | 219/390 |
| 7,312,422 B2 * | 12/2007 | Wintenberger et al. | 219/390 |
| 7,780,439 B2 * | 8/2010 | Alipour et al. | 432/201 |
| 2001/0010307 A1 * | 8/2001 | Saito et al. | 219/390 |
| 2002/0086260 A1 * | 7/2002 | Shang et al. | 432/247 |
| 2008/0206497 A1 * | 8/2008 | Hachiga et al. | 428/34.5 |

FOREIGN PATENT DOCUMENTS

| | | |
|---|---|---|
| DE | 24 05 491 A1 | 5/1975 |
| DE | 30 14 691 C2 | 10/1980 |
| DE | 93 17 009 U1 | 4/1994 |
| JP | 62-167096 | 10/1987 |
| JP | 7-21389 | 3/1995 |
| JP | 10-318681 | 12/1998 |

OTHER PUBLICATIONS

Official Communication issued in corresponding German Patent Application No. 112007000703.6, mailed on Jun. 9, 2009.
International Search Report with English language translation.
Written Opinion with English language translation.

* cited by examiner

HEAT-TREATING FURNACE

CROSS-REFERENCE TO RELATED APPLICATIONS

This is a continuation under 35 U.S.C. §111(a) of PCT/JP2007/055410 filed Mar. 16, 2007, and claims priority of JP2006-081539 filed Mar. 23, 2006, both incorporated by reference.

BACKGROUND

1. Technical Field

The present disclosure relates to a heat treating furnace, and more particularly to a heat-treating furnace, such as a firing furnace, a degreasing furnace, or the like, for heat-treating a material to be heat-treated, including a step of firing a green ceramic body and a step of removing a binder before the firing step, for example, in the manufacture of ceramic electronic components.

2. Background Art

FIG. 6 is a drawing showing an example of a conventional heat-treating furnace. In general, a firing furnace including a so-called module heater 64 which includes a heater 63 disposed in a heat insulator 62, such as a ceramic wool material, around a heat-treatment region 65 in a case 61 as schematically shown in FIG. 6 is widely used as a firing furnace for firing a material to be fired, such as a ceramic molding (green ceramic body) in a process for manufacturing a ceramic electronic component.

However, such a firing furnace is mainly used for firing a ceramic molding after the binder removing step and is generally difficult to use for binder removal.

This is because when a binder is removed using a heat-treating furnace provided with the module heater 64 as shown in FIG. 6 in which a material 66 to be fired, such as a ceramic molding (green ceramic body), is placed in the heat treatment region 65, a vapor of the binder permeates into the heat insulator 62 of the module heater 64 which is composed of ceramic wool. The vapor condenses and solidifies in the heat insulator 62, thereby causing a large difference in thermal expansion coefficient between a portion in which the binder vapor has permeated and a portion in which the binder vapor has not permeated, thus causing peeling or breakage of the heat insulator 62 in some cases.

Therefore, when binder removal and subsequent firing are continuously performed, a heat treating furnace provided with an inner case (inner muffle) is used in order to prevent binder vapor produced in the binder removing step from permeating into the heat insulator composed of a ceramic wool material.

That is, the inner case is provided inside the case in order to prevent the binder vapor produced in the binder removing step from condensing and adhering to the heat insulator by cooling with the inner wall of the case, so that the binder vapor is prevented from leaking outward from the inner case and condensing by contact with the inner wall of the case.

As such a heat-treating furnace using an inner case, a heat-treating furnace shown in FIG. 7 has been proposed (refer to Patent Document 1).

The heat-treating furnace of FIG. 7 is a heat-treating furnace used for producing a sintered body of ceramic or a metal. For example, when a ceramic material is heat-treated, the heat-treating furnace is aimed at permitting heat treatment without release of impurities such as decomposition gas and combustion gas of a binder to the atmosphere and facilitating maintenance.

As shown in FIG. 7, the heat-treating furnace is configured such that a material 73 to be treated is heat-treated in an inner case 72 which is provided in a furnace body 71 and which is made of a graphite plate and gaseous impurities such as binder vapor produced from the material 73 are discharged from the inner case 72 to outside the furnace body 71. In addition, an impurity collecting trap 75 having an inlet 74 at the top thereof is provided outside the furnace body 71 so that the impurities produced in the inner case 72 are introduced into the impurity collecting trap 75 through an outlet tube 76 and collected.

The heat treating furnace is capable of efficiently removing impurities without discharge to the atmosphere and facilitating maintenance because of its simple configuration, thereby decreasing operating cost and maintenance cost.

However, the heat treating furnace requires not only the inner case disposed in the furnace body but also the outlet tube 76 and the impurity collecting trap 75, and thus the configuration is complicated and causes the problem of increasing the size of equipment and cost.

Although a heat treating furnace including a case with the inner wall covered with a metal muffle is also known, covering the inner wall of the case with the metal muffle has the following problems:

The maximum operating temperature depends on the heat resistance temperature of a metal which constitutes the metal muffle, and thus the operating conditions of the furnace are limited.

A measure against creep deformation of the metal which constitutes the metal muffle is required, and thus the inner dimensions of the furnace are limited.

The inside of the furnace is divided into a heat treatment region partitioned with the metal muffle and another region, and thus the dimensions of the heat treating furnace are increased relative to the necessary effective furnace dimensions, thereby increasing the size of equipment.

The furnace has a double structure, and thus much time is required for assembly and manufacture, thereby increasing the cost.

There is another conceivable heat treating furnace including a case with the inner wall composed of a ceramic board. However, the binder vapor produced in a degreasing step permeates through the ceramic board, reaches the inner wall of the case, and condenses on the inner wall (i.e., the back of a heat insulator) of the case at a temperature lower than the condensation temperature of the binder vapor. The condensed vapor permeates into the heat insulator and solidifies therein to cause the problem of not only increasing the thermal conductivity of the heat insulator but also producing a large difference in thermal conductivity between a portion in which the vapor permeates and a portion in which the vapor does not permeate, causing peeling and breakage of the heat insulator. In particular, when a module heater having a metal heater embedded in a heat insulator is used, there is the problem of decreasing the insulation of the metal heater embedded in the heat insulator within a short time.

Patent Document 1: Japanese Examined Patent Application Publication No. 7-21389

SUMMARY

The heat treating furnace described herein solves the above-mentioned problems is capable of continuously performing binder removal and subsequent firing without requiring a complicated configuration and increasing the equipment size and cost, for example, when a green ceramic body is fired in a process for manufacturing a ceramic electronic component.

In order to solve the problems, a heat treating furnace may include:

a case;

a heat treatment region disposed in the case, for receiving a material therein to be heat-treated;

a heater for heating the heat treatment region to a predetermined temperature;

a heat insulator disposed to surround the heat treatment region; and a reflector disposed between the heat insulator and the inner wall of the case, for reflecting heat transferred from the heat treatment region through the heat insulator.

In the heat treating furnace, a principal portion of the heater is advantageously disposed in the heat insulator.

The reflector advantageously has a structure in which a plurality of thin plates composed of a metal material with heat resistance is disposed so that the main surfaces of the thin plates are arranged in parallel to each other with a predetermined space between the adjacent main surfaces.

Preferably, partition heat insulators are disposed between the respective thin plates constituting the reflector, for suppressing gas convections between the respective thin plates.

The reflector is preferably disposed to cover the substantially entire peripheral surface of the heat insulator.

Thus, the heat treating furnace advantageously includes the case; the heat treatment region disposed in the case, for receiving therein a material to be heat-treated; the heater for heating the heat treatment region to a predetermined temperature; the heat insulator disposed to surround the heat treatment region; and the reflector disposed between the heat insulator and the inner wall of the case, for reflecting heat transferred from the heat treatment region through the heat insulator. Therefore, the temperature on the back of the heat insulator can be increased to be higher than the condensation temperature of binder vapor by radiant heat, and thus a component of the binder can be prevented from condensing and solidifying in the heat insulator.

As a result, a heat treating furnace can be configured without the need for an inner case and a metal lining of a heat treatment region, and thus it is possible to provide a heat treating furnace having a simple structure and being capable of continuously performing binder removal and subsequent firing without increasing the size of equipment and cost when a green ceramic molding is fired in a process for manufacturing a ceramic electronic component.

When a principal portion of the heater is disposed in the heat insulator, i.e., when the heater is a module heater including a heater disposed in a heat insulator, the structure of the heat treating furnace can be simplified, and limitations of the inner dimensions of the furnace can be decreased, thereby permitting the effective utilization of the heat treatment region.

That is, in a conventional heat treating furnace, a module heater is a firing heater and cannot be used directly for degreasing, and an inner case is required when the module heater is also used for degreasing. However, when a reflector is provided on the back of the module heater, the binder component can be prevented from condensing and solidifying in the heat insulator. It is thus possible to provide a heat treating furnace capable of continuously performing degreasing and subsequent firing using a module heater without the need for an inner case.

In addition, in a firing furnace at a relatively low temperature of 1000° C. or lower, the structure of the heat treating furnace can be simplified using a module heater including a heater embedded in a heat insulator, thereby decreasing the cost.

Therefore, a heat treating furnace advantageously uses a so-called module heater including a heater embedded in a heat insulator.

When the reflector has a structure in which a plurality of thin plates composed of a metal material with heat resistance is disposed so that the main surfaces of the thin plates are arranged in parallel to each other with a predetermined space between the adjacent main surfaces, it is possible to securely prevent the binder vapor produced in a binder removing step from condensing and solidifying in the heat insulator and prevent peeling and breakage of the heat insulator due to deterioration, for example, when a ceramic molding containing a binder is fired. Therefore, the heat treating furnace can be made more effective.

In addition, the temperature of the back of the heat insulator (the temperature of the peripheral surface of the heat insulator which faces the reflector) can be controlled by controlling the number of the thin plates constituting the reflector and composed of a metal material with heat resistance, thereby permitting optimum design for the operating conditions of the heat treating furnace.

Further, the surface temperature of the reflector can be set to a desired value by appropriately determining the thickness of the heat insulator and the number of the thin plates constituting the reflector for the furnace temperature. As a result, even when the atmosphere in the furnace is an oxidizing atmosphere, the need for an expensive material as a constituent material of the reflector can be eliminated, thereby achieving an economically desired insulation effect.

When partition heat insulators are disposed in the heat treating furnace between the respective thin plates constituting the reflector, for suppressing gas convections between the respective thin plates, gas convections present between the respective thin plates can be prevented by the partition heat insulators, and convections occur in predetermined regions partitioned by the partition heat insulators. Therefore, the heat insulation efficiency of the reflector can be improved.

Further, for example, when partition heat insulators are respectively disposed substantially parallel to the upper side and the lower side of the thin plates which constitute the reflector vertically disposed, a region where convection occurs is decreased as the distance between the upper and lower partition heat insulators is decreased. Therefore, convective heat transfer can be suppressed, improving the heat insulation efficiency.

When the reflector is disposed to cover substantially the entire peripheral surface of the heat insulator, it is possible to securely prevent the binder vapor produced in a binder removing step from condensing and solidifying in the heat insulator and also prevent peeling and breakage of the heat insulator due to deterioration, for example, when a ceramic molding containing a binder is fired. Therefore, the heat treating furnace can be made more effective.

Other features and advantages will become apparent from the following description of embodiments, which refers to the accompanying drawings.

DETAILED DESCRIPTION

Figure 1:
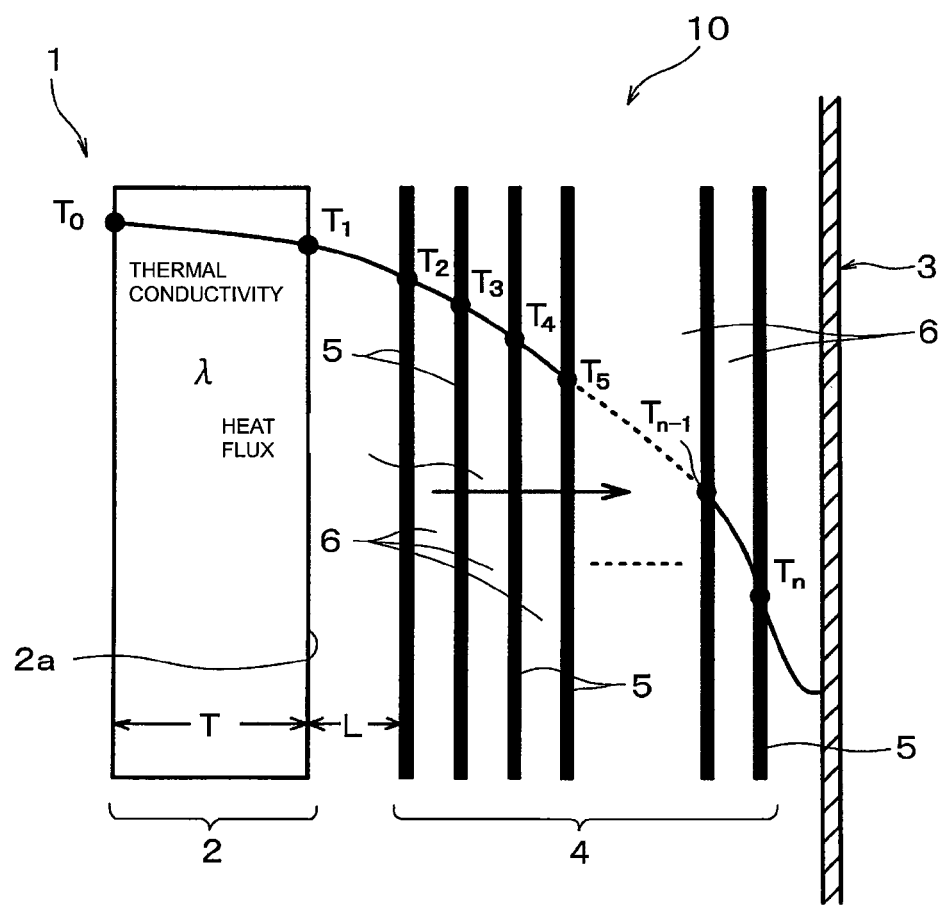
FIG. 1 is a drawing illustrating the function of a heat insulator and a reflector provided in a heat treating furnace.

Reference Numerals 1 heat treatment region
2 heat insulator
2a outer surface of heat insulator
3 case
4 reflector
5, 5a, 5b thin plate
6 air layer
7 heater
8 module heater
9 door
10 heat treating furnace
12a, 12b partition heat insulator
15 upper side
16 lower side
20 region partitioned by partition heat insulator
21 stud bolt
D distance between partition heat insulators
L distance between the back of partition heat insulator and reflector
T thickness of module heater A heat treating furnace of the present invention includes a case; a heat treatment region disposed in the case, for receiving therein a material to be heat-treated; a heater for heating the heat treatment region; and a heat insulator disposed to surround the heat treatment region. In the heat treating furnace, a reflector is disposed between the heat insulator and the inner wall of the case, i.e., outside (back) of the heat insulator, for reflecting heat transferred from the heat treatment region through the heat insulator.

The reflector used has a structure in which a plurality of thin plates made of a heat-resistant metal (e.g., SUS310, SUS304, or the like) such as stainless is arranged so that the main surfaces face each other with a predetermined space between the adjacent main surfaces. The reflector functions to reflect heat rays.

The forms of heat transfer are classified into the three forms, i.e., heat conduction, convective heat transfer, and radiant (radiation) heat transfer. The disclosed reflector mainly functions to suppress radiant (radiation) heat transfer due to radiation of heat rays.

The heat transfer mechanism of a heat treating furnace which is provided with a reflector is described below with reference to FIG. 1. FIG. 1 shows the inside of a case 3 and shows a principal portion of a heat treating furnace 10 provided with a heat insulator 2 which is disposed to surround a heat treatment region 1 receiving therein a material to be heat-treated, and a reflector 4 which is disposed outside (back) of the heat insulator 2 and between the heat insulator 2 and the inner wall of the case 3 and which includes a plurality of thin plates 5.

In the heat treating furnace 10 shown in FIG. 1, when the heat treatment region 1 is at a predetermined heat treatment temperature ($T_0°$ C.), heat is transferred from the heat treatment region 1 to outside the heat insulator 2 by heat conduction through the heat insulator 2. The temperature (boundary temperature) $T_1°$ C. of the outer surface 2a of the heat insulator 2 equilibrates by conductive heat resistance of the heat insulator 2.

When the heat transferred to the outer surface 2a of the heat insulator 2 reaches the reflector 4, the heat is transferred to the case 3 by radiation and convection, and heat conduction through the plurality of thin plates 5 constituting the reflector 4 and air layers 6 between the plurality of thin plates 5.

The heat transfer to the reflector 4 is mainly caused by radiation. Although convective heat transfer has less influence than radiation, it is preferred to take convective heat transfer into consideration in order to improve precision.

In addition, absorption and reflection of heat rays are repeated between the plurality of thin plates 5 constituting the reflector 4, finally attaining equilibrium at respective temperatures of $T_2$ to $T_n$. The temperature $T_n$ corresponds to the temperature of the case 3.

Further, on the outer surface of the case 3, heat is transferred to the outside air by convection and radiation to the outside air. Since the quantities of heat transferred in the respective regions (i.e., the respective air layers 6 between the plurality of thin plates 5 constituting the reflector 4) are substantially equal, the temperature at thermal equilibrium is determined at each of the plurality of thin plates 5 constituting the reflector 4.

Therefore, when the conditions (thermal conductivity and insulator thickness) of the heat insulator 2 are constant, the back temperature of the heat insulator 2 can be arbitrarily controlled by controlling (changing) the number of the thin plates 5 constituting the reflector 4. Namely, the thermal resistance of the reflector 4 can be increased by increasing the number of the thin plates 5 constituting the reflector 4, thereby increasing the back temperature of the heat insulator 2.

As a result, the number of the thin plates 5 constituting the reflector 4 can be appropriately determined for the selected heat insulator 2 so that the back temperature of the heat insulator 2 can be securely kept at, for example, a temperature higher than the condensation temperature of binder vapor. Therefore, the binder component can be prevented from condensing and solidifying in the heat insulator 2.

Further, when the temperature of the heat treatment region 1 is set at its maximum, the back temperature of the heat insulator 2 can be set to a temperature higher than the oxidation temperature (e.g., 400° C.) of carbon derived from the binder vapor.

In the heat treating furnace having the heat insulation structure designed as described above, basically, heat treatment can be performed without accumulating the binder in the heat insulator and without using an inner muffle even in a degreasing step in which a large amount of binder vapor is produced. Also, because no need to use the inner muffle, the size of equipment and the equipment cost can be significantly decreased.

In a comparative example, the reflector 4 is provided in both a region where the heat insulator 2 is used, and a region where the reflector is used without the heat insulator 2, would require the number of the thin plates constituting the reflector 4 to be excessively increased. The reflector 4 is estimated to have an emissivity ε of 0.2 to 0.4 (i.e., a reflectance of 0.8 to 0.6) and accordingly has a small heat shield effect at a high temperature (temperature region of 600° C. or more). Therefore, this is not a practical configuration.

In addition, in the comparative example, when the reflector 4 is used in a region where the heat insulator 2 is also used, the emissivity ε of the reflector 4 may increase within a short time due to oxidation of the metal which is the constituent material of the thin plates 5 constituting the reflector 4, thereby causing difficulty in an oxidizing atmosphere. It is thus undesirable to use the reflector 4 in a region where the heat insulator 2 to be used.

In a heat treating furnace as disclosed herein, the combination of the heat insulator 2 and the reflector 4 can realize a heat treating furnace capable of long-term stable use even in an oxidizing atmosphere. Therefore, the heat insulator 2 and the reflector 4 are preferably used in combination in a thermal insulation configuration.

Embodiments will be described in further detail below.

EMBODIMENT 1

Figure 2:
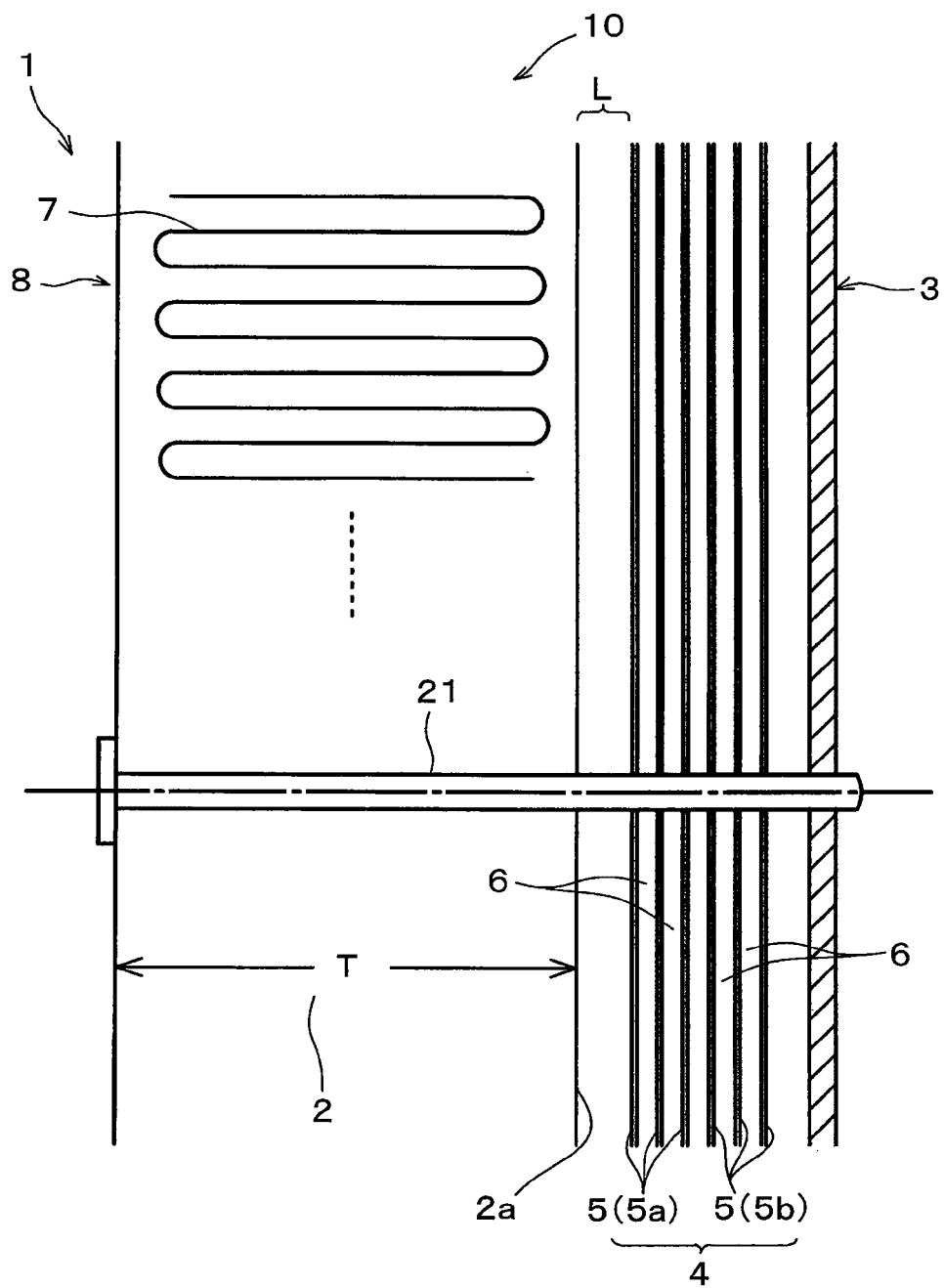
FIG. 2 is a drawing schematically showing a principal configuration of a heat treating furnace according to an embodiment (Embodiment 1).
Figure 3:
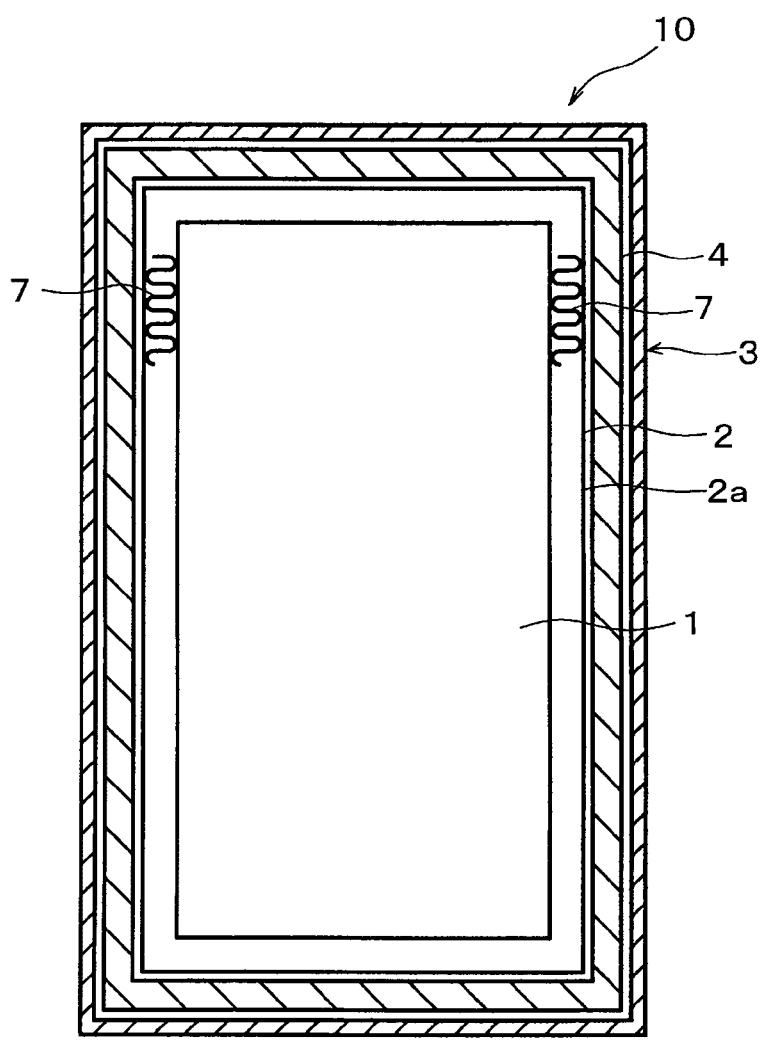
FIG. 3 is a sectional front view schematically showing a configuration of a heat treating furnace according to Embodiment 1.
Figure 4:
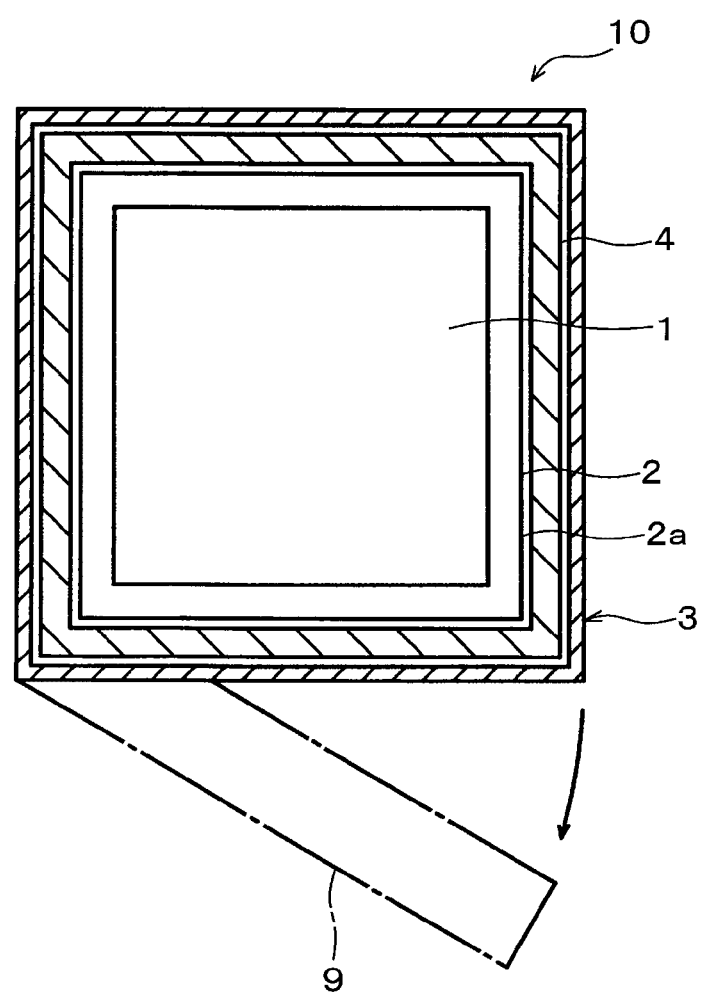
FIG. 4 is a sectional plan view schematically showing a configuration of a heat treating furnace according to Embodiment 1.

FIGS. 2 to 4 are drawings each showing a configuration of a heat treating furnace according to an embodiment (Embodiment 1). FIG. 2 is a sectional view showing a principal configuration. FIG. 3 is a sectional front view schematically showing a configuration of a heat treating furnace. FIG. 4 is a sectional plan view schematically showing a configuration of a heat treating furnace.

A heat treating furnace 10 is one for continuously performing a degreasing step and a sintering step for a ceramic laminate for a ceramic multilayer substrate using low-temperature sinterable ceramic green sheets. A material to be heat-treated by the heat treating furnace is a ceramic laminate prepared by laminating thin ceramic green sheets and contains about 20% by weight of a binder.

As schematically shown in FIG. 2, the heat treating furnace used in Embodiment 1 includes a case 3 provided with a heat treatment region 1 for receiving therein the material to be heat-treated and a front door 9 (FIG. 4) for taking in and out the material to be heat-treated, a heater 7 for heating the heat treatment region 1 to a predetermined temperature, a heat insulator 2 disposed to surround the heat treatment region 1 in the case 3 and composed of ceramic fibers, and a reflector 4 disposed between the heat insulator 2 and the inner wall of the case 3, for reflecting heat transferred from the heat treatment region 1 through the heat insulator 2.

A kanthal wire is used as the heater 7. The heater 7 having the kanthal wire is embedded in the heat insulator 2. In the heat treating furnace of Embodiment 1, the heat insulator 2 and the heater 7 embedded in the heat insulator 2 constitute a so-called module heater 8.

The thickness T of the module heater 8 (heat insulator 2) in this embodiment is 100 nm, and the thermal conductivity λ is 0.12 W/mK.

The reflector 4 is composed of a total of six thin plates 5 including three SUS316 thin plates 5 (5a) disposed near the heat insulator 2 and three SUS304 thin plates 5 (5b) disposed outside the three thin plates 5a. The thin plates 5 are attached to the heat insulator 2 and the case 3 through a stud bolt 21.

The emissivity ε of the reflector of Embodiment 1 is 0.4 (reflectance: 0.6).

Further, the distance L between the back (outer surface 2a) of the heat insulator 2 and the reflector 4 is 10 mm, and each of the distances between the plurality of thin plates 5a, between the thin plates 5b, and between the thin plates 5a and 5b is 10 mm.

As described above, in the heat treating furnace of Embodiment 1 having a thermal insulation structure in which the heat insulator 2 and the reflector 4 are combined, the back temperature of the heat insulator 2 can be kept at 230° C. when the temperature of the heat treatment region 1 is 300° C. at which the amount of binder vapor produced is maximized.

In addition, the back temperature of the heat insulator 2 can be kept at 603° C. when the temperature of the heat treatment region 1 is the highest temperature of 900° C.

As a result, the binder can be securely prevented from condensing and solidifying on the back of the heat insulator, thereby permitting stable heat treatment.

In other words, the heat treating furnace of Embodiment 1 is provided with the reflector 4 which is disposed between the heat insulator 2 and the inner wall of the case 3, for reflecting heat transferred from the heat treatment region 1 through the heat insulator 2. Therefore, the back temperature of the heat insulator can be adjusted to be higher than the condensation temperature of binder vapor by radiant heat, and the binder component can be prevented from condensing and solidifying in the heat insulator.

As a result, a heat treating furnace can be configured without the need for a metal lining of a heat treatment region and an inner case, and binder removal and subsequent firing can be continuously performed with a simple structure without increasing the equipment size and cost, for example, when a ceramic molding is fired in a process for manufacturing a ceramic electronic component.

Further, since the heat treating furnace of Embodiment 1 uses the module heater 8 including the heater 7 disposed in the heat insulator 2, a small, economically excellent heat treating furnace having a simple structure can be provided. In the configuration of the above-described conventional heat treating furnace, when a module heater is used as the heater, binder vapor condenses in the heat insulator, causing peeling and breakage of the heat insulator. However, since the heat treating furnace is provided with the reflector 4 as described above, the back temperature of the heat insulator can be controlled to be higher than the condensation temperature of binder vapor by radiant heat, and the heat insulator can be prevented from being peeled and broken due to condensation of the binder vapor. Therefore, the heat treating furnace is particularly useful when configured to use a module heater.

Further, the heat treating furnace of Embodiment 1 uses the reflector 4 having a structure in which a plurality of the stainless thin plates 5 is disposed so that the main surfaces of the respective thin plates 5 are arranged in parallel to each other with a predetermined space between the adjacent main surfaces, the reflector 4 being disposed to cover the substantially entire peripheral surface of the heat insulator 2. Therefore, it is possible to securely prevent the binder vapor produced in a binder removing step from condensing and solidifying in the heat insulator and prevent peeling and breakage of the heat insulator due to deterioration. Further, the back temperature of the insulator 2 can be controlled by adjusting the number of the thin plates 5 constituting the reflector 4, and optimum design can be made for the operating conditions of the heat treating furnace. The substantially entire peripheral surface of the heat insulator represents the entire peripheral surface excluding a portion such as a wiring hole, in which a gap is inevitably formed from the viewpoint of design, and a joint of the reflector.

In addition, the surface temperature of the reflector 4 can be arbitrarily set for the furnace temperature by appropriately determining the thickness T of the heat insulator 2 and the number of the thin plates 5 constituting the reflector 4. Therefore, even when the atmosphere in the furnace is an oxidizing atmosphere, a desired adiabatic effect can be achieved without using an expensive material as the constituent material of the reflector 4.

EMBODIMENT 2

Figure 5:
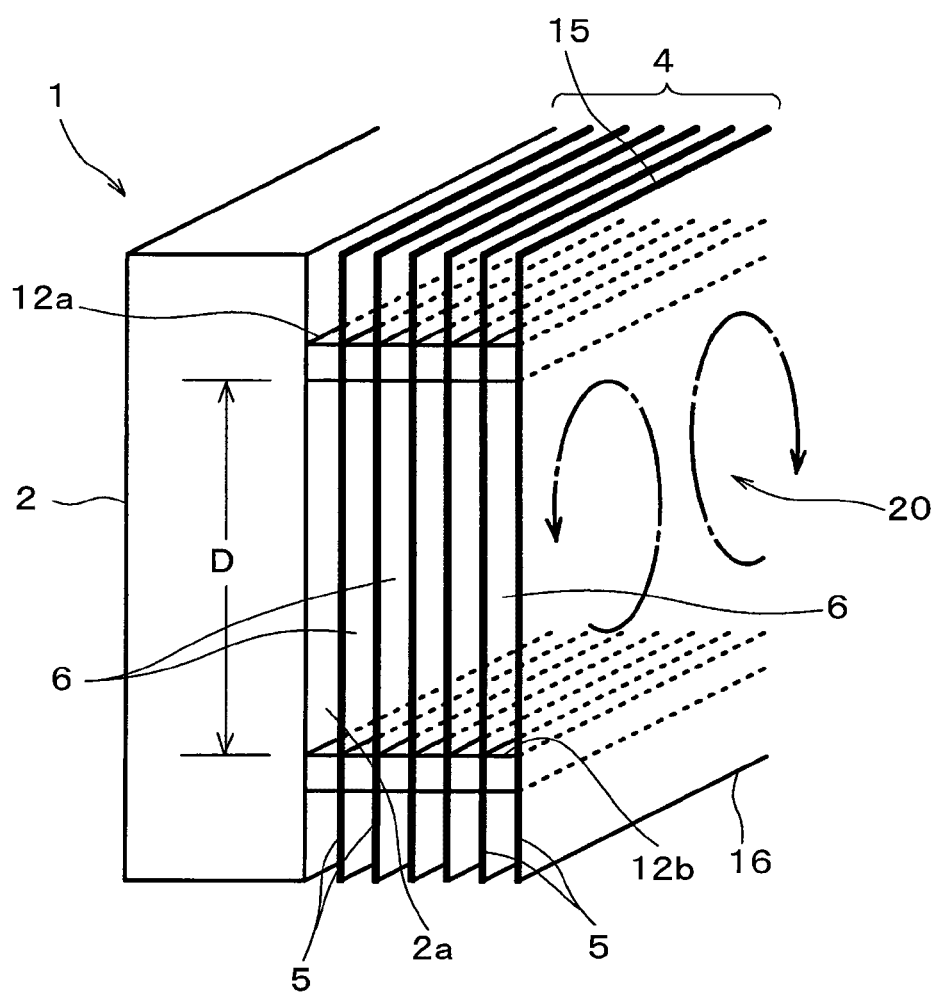
FIG. 5 is a perspective view schematically showing a configuration of a heat treating furnace according to another embodiment (Embodiment 2).
Figure 6:
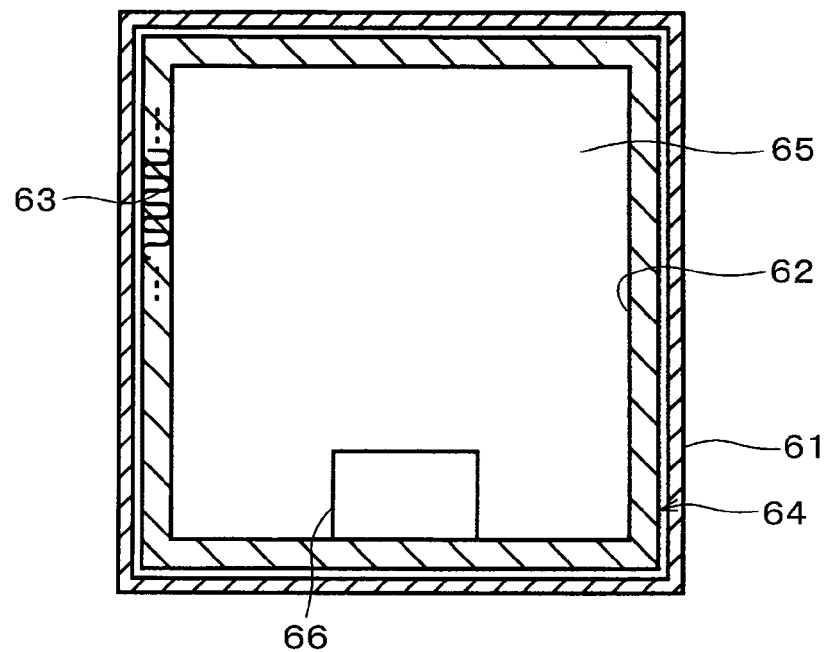
FIG. 6 is a sectional view schematically showing a configuration of a conventional heat treating furnace used for heat-treating a ceramic material in a process for manufacturing a ceramic electronic component.
Figure 7:
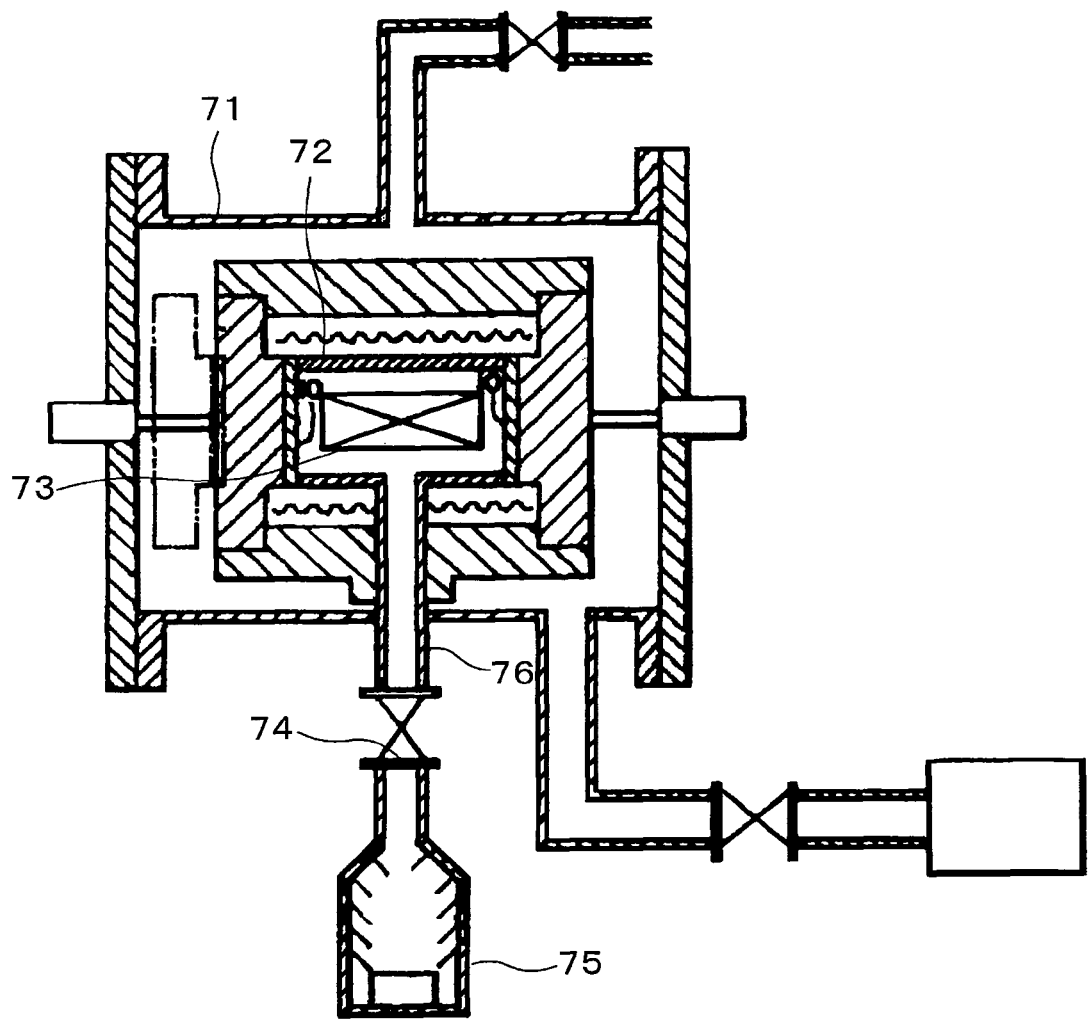
FIG. 7 is a drawing showing an example of a conventional heat treating furnace having a structure in which an inner case is disposed in a furnace body.

FIG. 5 is a drawing showing a principal portion of a heat treating furnace according to another embodiment (Embodiment 2).

In the heat treating furnace of Embodiment 2, partition heat insulators 12a and 12b are disposed on both the upper and lower sides of the spaces between the plurality of thin plates 5, which constitute a reflector 4, so as to be substantially parallel to the upper side 15 and the lower side 16 of the thin plates 5, for suppressing the passage of gas between the respective thin plates 5. The other configuration is the same as in the heat treating surface of Embodiment 1.

In FIG. 5, the portion denoted by the same reference numeral as in FIGS. 1 to 4 is the same as or corresponds to FIGS. 1 to 4.

As in the heat treating furnace of Embodiment 2, when partition heat insulators 12a and 12b are disposed on the upper and lower sides of the spaces between the plurality of thin plates 5, which constitute a reflector 4, so as to be substantially parallel to the upper side 15 and the lower side 16 of the thin plates 5 and to suppress the passage of gas between the respective thin plates 5, convections of gases present between the thin plates 5 take place within regions 20 partitioned by the partition heat insulators 12a and 12b, and the heat insulation efficiency of the reflector 4 can be improved.

In addition, conductive heat transfer can be suppressed by decreasing the distance D between the partition heat insulator 12a substantially parallel to the upper side 15 and the partition heat insulator 12b substantially parallel to the lower side 16, thereby improving the heat insulation efficiency.

In a hot press furnace for firing a material to be heat-treated under pressing it is difficult to completely cover the inside of the furnace with a metal muffle because an insertion inlet for a press rod is needed. Therefore, the temperature of a case tends to be higher than in a usual heat treating furnace because of insufficient heat insulation, leading to a problem of weld cracking and a decrease in case durability. However, the heat treating furnace provided with the reflector is capable of sufficiently decreasing the temperature of the case and avoiding the problem of weld cracking and the problem of decreasing durability of the case.

In Embodiments 1 and 2, the use of the reflector 4 including a total of six thin plates 5 made of stainless steel (SUS316 and SUS304) is described as an example. However, the material of the thin plates 5 constituting the reflector 4, the number of the thin plates 5, and the distance between the thin plates 5 constituting the reflector 4 are not particularly limited, and various applications and modifications can be added in consideration of the operating conditions of the heat treating furnace.

In Embodiments 1 and 2, the heat treating furnace used for degreasing and sintering a ceramic laminate for a ceramic multilayer substrate is described as an example. However, the material to be heat-treated is not limited to this, and the heat treating furnace can be widely applied for heat-treating a ceramic laminate which is prepared by laminating ceramic green sheets containing a binder and various types of ceramic materials (materials to be treated) in order to remove the binder and sinter the materials, for example, in a process for manufacturing a multilayer ceramic capacitor.

Further, the heat treating furnace can be used not only for heat-treating a ceramic material to remove the binder and sinter the material but also for heat treatment of various materials to be treated which produce a decomposition gas, combustion gas, and evaporating gas in a heat treatment step.

Although, in the embodiments, the use of the heat insulator composed of ceramic fibers is described as an example, the type of the heat insulator is not limited to this, and various known materials can be used.

Further, although the embodiments use the so-called module heater 8 including the heater embedded in the heat insulator 2, the heat treating furnace is not limited to using a module heater and can also be applied to a heat treating furnace having a configuration in which a heat insulator and a heater are separated.

In view of these and other points, the present invention is not limited to the above-described embodiments, and various applications and modification can be added within the scope of the present invention.

As described above, the heat treating furnace is provided with the reflector which is disposed between the heat insulator and the inner wall of the case, for reflecting heat transferred from the heat treatment region through the heat insulator. Therefore, the back temperature of the heat insulator can be controlled to be higher than the condensation temperature of binder vapor by radiant heat, and the binder component can be prevented from condensing and solidifying in the heat insulator. As a result, it is possible to provide a small and economically excellent heat treating furnace not requiring an inner case and a metal lining of a heat treatment region and being capable of stable heat treatment for, for example, heat-treating a material to be heat-treated, which produces binder vapor in a heat treatment step, such as a ceramic material used in a process for manufacturing a ceramic electronic component.

Therefore, the heat treating furnace can be widely used for manufacturing various ceramic electronic components, e.g., a ceramic multilayer substrate, a multilayer ceramic capacitor, and the like, which are manufactured through a binder removing step and a subsequent primary firing step.

Although particular embodiments have been described, many other variations and modifications and other uses will become apparent to those skilled in the art. Therefore, the present invention is not limited by the specific disclosure herein.

What is claimed is:

1. A heat treating furnace comprising:
   a case;
   a heat treatment region disposed in the case and arranged to receive therein a material to be heat-treated;
   a heater disposed inside the case and arranged to heat the heat treatment region to a predetermined temperature;
   a heat insulator disposed inside the case, arranged to surround the heat treatment region, and composed of ceramic fibers;
   a reflector disposed inside the case and between the heat insulator and an inner wall of the case and arranged to reflect heat transferred from the heat treatment region through the heat insulator; wherein
   the reflector is spaced away from the heat insulator and surrounds substantially an entire peripheral surface of the heat insulator; and
   the heater is disposed in the heat insulator.

2. The heat treating furnace according to claim 1, wherein the reflector includes a plurality of thin plates composed of a metal material with heat resistance, wherein main surfaces of the plurality of thin plates are arranged in parallel or substantially in parallel to each other with a predetermined space between adjacent ones of the main surfaces.

3. The heat treating furnace according to claim 2, wherein partition heat insulators are disposed between respective ones of the plurality of thin plates of the reflector so as to suppress gas convection between the respective ones of the plurality of thin plates.

4. The heat treating furnace according to claim 1, wherein the reflector includes a plurality of thin plates composed of a metal material with heat resistance, wherein main surfaces of the plurality of thin plates are arranged in parallel or substantially in parallel to each other with a predetermined space between adjacent ones of the main surfaces.

5. The heat treating furnace according to claim 4, wherein partition heat insulators are disposed between respective ones of the plurality of thin plates of the reflector so as to suppress gas convection between the respective ones of the plurality of thin plates.

* * * * *